US012641758B2

(12) United States Patent
Nelson et al.

(10) Patent No.: US 12,641,758 B2
(45) Date of Patent: May 26, 2026

(54) HEAT SINK COMPONENT WITH LAND GRID ARRAY CONNECTIONS

(71) Applicant: KYOCERA AVX Components Corporation, Fountain Inn, SC (US)

(72) Inventors: Cory Nelson, Simpsonville, SC (US); Marianne Berolini, Greer, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 198 days.

(21) Appl. No.: 17/891,208

(22) Filed: Aug. 19, 2022

(65) Prior Publication Data

US 2023/0070808 A1     Mar. 9, 2023

Related U.S. Application Data

(60) Provisional application No. 63/242,068, filed on Sep. 9, 2021.

(51) Int. Cl.
| | |
|---|---|
| *H05K 7/20* | (2006.01) |
| *H05K 1/02* | (2006.01) |
| *H05K 1/11* | (2006.01) |
| *H05K 1/18* | (2026.01) |
| *H05K 1/181* | (2026.01) |
| *H05K 1/184* | (2026.01) |

(52) U.S. Cl.
CPC ............ *H05K 7/209* (2013.01); *H05K 1/116* (2013.01); *H05K 1/0212* (2013.01); *H05K 1/11* (2013.01); *H05K 1/111* (2013.01); *H05K 1/112* (2013.01); *H05K 1/115* (2013.01); *H05K 1/181* (2013.01); *H05K 1/184* (2013.01); *H05K*

*7/2039* (2013.01); *H05K 7/205* (2013.01); *H05K 2201/066* (2013.01); *H05K 2201/09218* (2013.01); *H05K 2201/09372* (2013.01); *H05K 2201/095* (2013.01)

(58) Field of Classification Search
CPC ... H05K 1/0201–021; H05K 2201/066; H05K 1/0203; H05K 1/212; H05K 1/0296; H05K 1/111; H05K 1/112; H05K 1/113; H05K 1/115; H05K 1/116; H05K 1/181; H05K 1/182; H05K 1/184; H05K 7/1422; H05K 7/2039; H05K 7/205; H05K 2201/09209; H05K 2201/09218; H05K 2201/09372; H05K 2201/095
See application file for complete search history.

(56) References Cited

U.S. PATENT DOCUMENTS

| | | | |
|---|---|---|---|
| 10,660,238 B2 | 5/2020 | Durgin | |
| 2004/0100778 A1* | 5/2004 | Vinciarelli | ............. H05K 1/141 |
| | | | 361/768 |

(Continued)

*Primary Examiner* — Jayprakash N Gandhi
*Assistant Examiner* — Steven Ngo
(74) *Attorney, Agent, or Firm* — Dority & Manning, P.A.

(57) ABSTRACT

A heat sink component can include a body including a thermally conductive material that is electrically non-conductive. The body can have a top surface, a bottom surface opposite the top surface, and a plurality of side surfaces. The heat sink component also can include a heat source terminal formed over the bottom surface of the body. The heat source terminal can be spaced apart from the plurality of side surfaces. The heat sink component further can include a heat sink terminal formed over the bottom surface of the body. The heat sink terminal can be spaced apart from the plurality of side surfaces.

18 Claims, 7 Drawing Sheets

(56)  References Cited

U.S. PATENT DOCUMENTS

| | | | |
|---|---|---|---|
| 2009/0017647 A1* | 1/2009 | Horiuchi | H05K 3/222 |
| | | | 439/76.1 |
| 2013/0321088 A1* | 12/2013 | Vidoni | H03L 1/04 |
| | | | 331/70 |
| 2018/0026022 A1* | 1/2018 | Lee | H01L 23/5386 |
| | | | 257/659 |
| 2020/0045819 A1* | 2/2020 | Yamamoto | H05K 1/18 |
| 2021/0329810 A1* | 10/2021 | Goergen | H05K 7/2039 |
| 2022/0120512 A1* | 4/2022 | DiChiara, Jr. | F28D 20/0056 |
| 2022/0130578 A1* | 4/2022 | Moriya | H01C 17/283 |

* cited by examiner

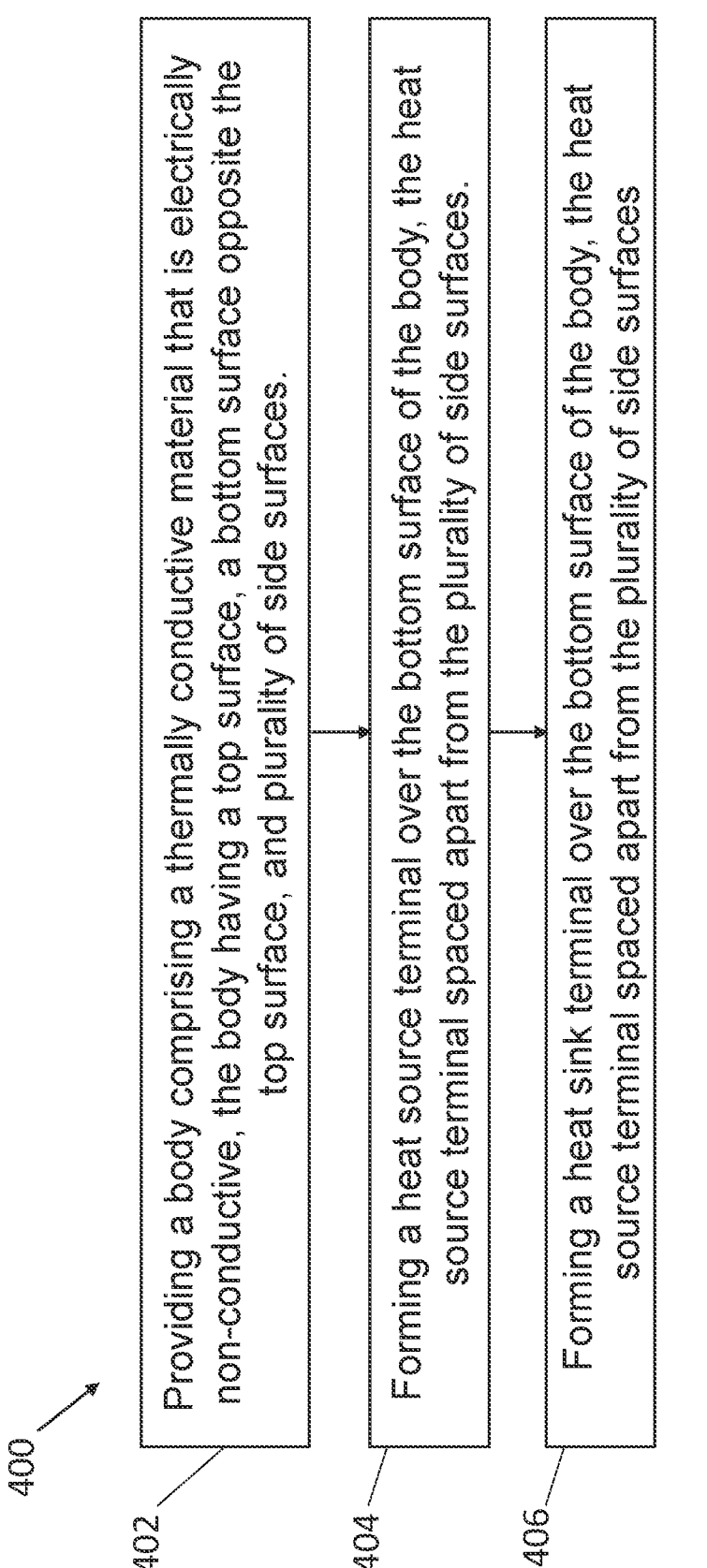

400

402 Providing a body comprising a thermally conductive material that is electrically non-conductive, the body having a top surface, a bottom surface opposite the top surface, and plurality of side surfaces.

404 Forming a heat source terminal over the bottom surface of the body, the heat source terminal spaced apart from the plurality of side surfaces.

406 Forming a heat sink terminal over the bottom surface of the body, the heat source terminal spaced apart from the plurality of side surfaces

FIG. 4

HEAT SINK COMPONENT WITH LAND GRID ARRAY CONNECTIONS

CROSS REFERENCE TO RELATED APPLICATION

The present application claims filing benefit of U.S. Provisional Patent Application Ser. No. 63/242,068 having a filing date of Sep. 9, 2021, which is incorporated herein by reference in its entirety.

BACKGROUND OF THE INVENTION

Electrical circuits, such as power amplifier circuits, generate heat during normal operation. Heat build-up may undesirably increase the temperature of the various components of the electrical circuit. If this heat is not sufficiently managed, for example by dissipation to a heat sink, the electrical device may overheat, resulting in damage to the electrical component.

SUMMARY OF THE INVENTION

In accordance with one embodiment of the present invention, a heat sink component can include a body comprising a thermally conductive material that is electrically non-conductive. The body can have a top surface, a bottom surface opposite the top surface, and a plurality of side surfaces. The heat sink component can include a heat source terminal formed over the bottom surface of the body. The heat source terminal can be spaced apart from the plurality of side surfaces. A heat sink terminal can be formed over the bottom surface of the body. The heat sink terminal can be spaced apart from the plurality of side surfaces.

In accordance with another embodiment of the present invention, a component assembly can include a device including a top surface and a plurality of terminals exposed on the top surface. A heat sink component can be mounted to the device. The heat sink component can include a body including a thermally conductive material that is electrically non-conductive. The body can have a top surface, a bottom surface opposite the top surface, and plurality of side surfaces. The heat sink component can include a heat source terminal formed over the bottom surface of the body. The heat source terminal can be spaced apart from the plurality of side surfaces of the body. A heat sink terminal can be formed over the bottom surface of the body. The heat source terminal can be spaced apart from the plurality of side surfaces. The heat source terminal can be connected with one of the plurality of terminals of the device. The heat sink terminal can be connected with another of the plurality of terminals of the device.

In accordance with another embodiment of the present invention, a method of manufacturing a heat sink component can include providing a body including a thermally conductive material that is electrically non-conductive. The body can have a top surface, a bottom surface opposite the top surface, and plurality of side surfaces. The method can include forming a heat source terminal over the bottom surface of the body. The heat source terminal can be spaced apart from the plurality of side surfaces. The method can include forming a heat sink terminal over the bottom surface of the body. The heat source terminal can be spaced apart from the plurality of side surfaces.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figure in which:

FIG. 4 is a flowchart of a method of manufacturing a circuit board including an embedded heat sink component according to aspects of the present disclosure.

Figure 1A:
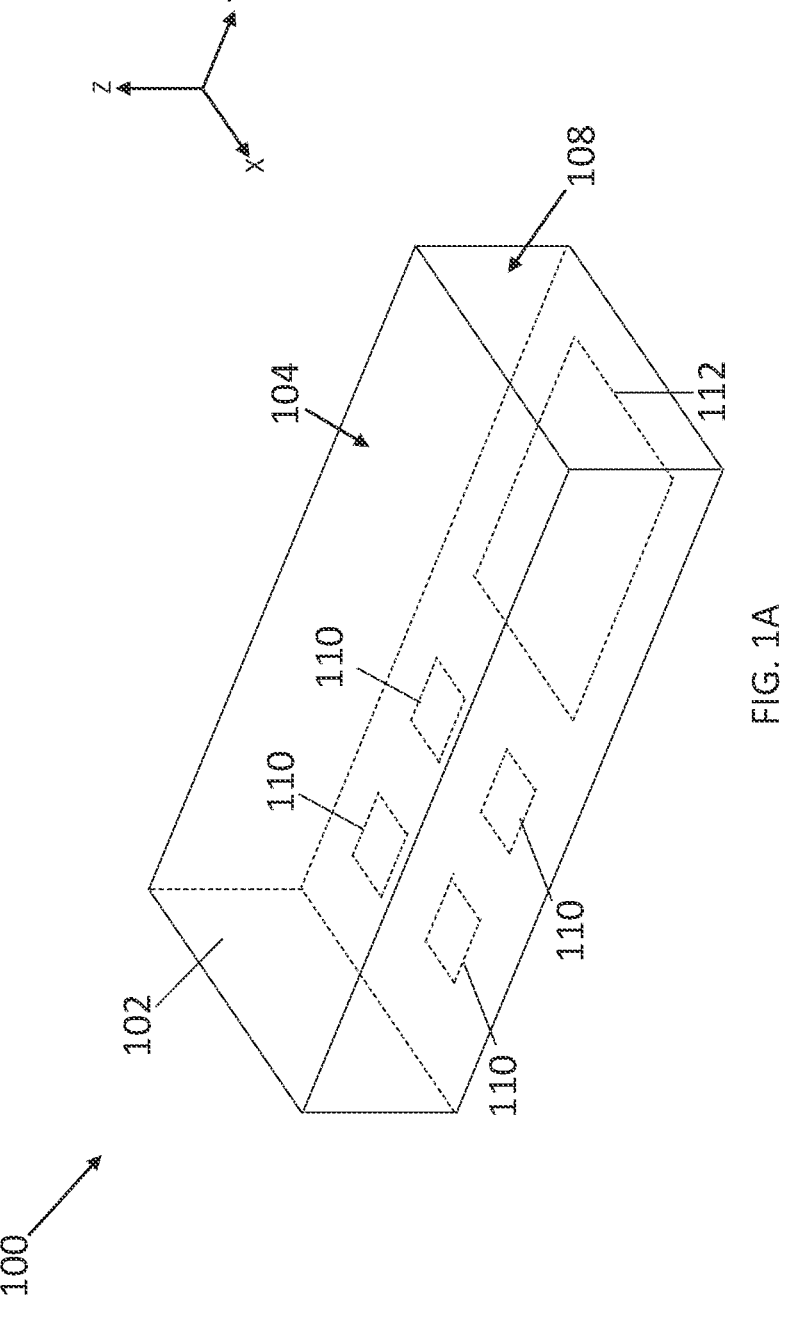
FIG. 1A is a perspective view of an example heat sink component having terminals configured for land grid array type mounting according to aspects of the present invention.

Repeat use of reference characters in the present specification and drawing is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

Generally speaking, the present invention is directed to a heat sink component that is configured for land grid array type surface mounting. The heat sink component can include a body including a thermally conductive material that is electrically non-conductive. The body can have a top surface, a bottom surface opposite the top surface, and a plurality of side surfaces. One or more heat source terminals can be formed over the bottom surface of the body. The heat source terminal(s) can be configured to connect with one or more respective electrical devices or components and conduct heat into the heat sink component from the electrical devices or components. The heat source terminal(s) can be exposed along the bottom surface of the body for land grid array type mounting of the heat sink component. The heat source terminal(s) can be spaced apart from the plurality of side surfaces. A heat sink terminal can be formed over the bottom surface of the body. The heat sink terminal can be spaced apart from the plurality of side surfaces.

In some embodiments, a plurality of heat source terminals can be formed over the bottom surface of the body of the heat sink component. The plurality of heat source terminals can be arranged in a variety of configurations. For example, the heat source terminals can be arranged in a grid or other suitable pattern, e.g., the heat source terminals can be exposed along the bottom surface of the body for land grid array type mounting of the heat sink component. The heat source terminals can be arranged in a manner that aligns with heat source terminals of a device (e.g., circuit board, electrical component), to which the heat sink component is configured to be mounted.

As used herein, a layer that is "formed over" an object can include the layer being directly formed on the object and the layer being formed over one or more intermediate layers that are between the layer and the object. Further, formed "over" a bottom surface refers to outward from a center of the component In some embodiments, the heat sink component can provide connections between the heat source terminals. For example, the connections can be or include direct electrical connections such that the heat sink component acts as an interposer between various heat source terminals. As another example, the connections can be or include thin-film components (e.g., capacitors, inductors, resistors, etc.).

For example, a via and an additional via may be formed in the body. The via may be connected with a heat source terminal and extend from the heat source terminal toward a surface of the body opposite the surface on which the heat source terminal is formed. The additional via may connected with an additional heat source terminal. The additional heat source terminal can be formed over the bottom surface of the body and extend from the additional heat source terminal toward a surface of the body opposite the surface on which the additional heat source terminal is formed. For instance, each of the heat source terminal and the additional heat source terminal can be formed over the bottom surface of the body, and each of the via and the additional via can extend from the respective heat source terminal to the top surface of the body. A thin-film component can be formed over the top surface of the body and electrically connected between the via at the top surface and the additional via at the top surface such that the thin-film component is electrically connected between the two heat source terminals.

However, in other embodiments, a conductive trace can be formed over the top surface of the body and can electrically connect the vias at the top surface such that the heat source terminals are electrically connected together by the conductive trace.

As indicated above, the heat sink component can be configured for land grid array type mounting. For example, the plurality of side surfaces can be free of electrically conductive material.

The heat sink component can include one or more thin film components. The thin film component can include one or more of a resistor, varistor, capacitor, inductor, and/or combinations thereof, such as a thin film filter. The thin film components may include one or more layers of conductive materials, dielectric materials, resistive materials, inductive materials, or other materials that are precisely formed using "thin film" technology.

As one example, the heat sink component can include a thin film varistor. The varistor can include barium titanate, zinc oxide, or any other suitable dielectric material. Various additives may be included in the dielectric material, for example, that produce or enhance the voltage-dependent resistance of the dielectric material. For example, in some embodiments, the additives may include oxides of cobalt, bismuth, manganese, or a combination thereof. In some embodiments, the additives may include oxides of gallium, aluminum, antimony, chromium, titanium, lead, barium, nickel, vanadium, tin, or combinations thereof. The dielectric material may be doped with the additive(s) ranging from about 0.5 mole percent to about 3 mole percent, and in some embodiments from about 1 mole percent to about 2 mole percent. The average grain size of the dielectric material may contribute to the non-linear properties of the dielectric material. In some embodiments, the average grain size may range from about 1 micron to 100 microns, in some embodiments, from about 2 microns to 80 microns.

As another example, the thin film component(s) can include a thin film resistor including one or more resistive layers. For example, the resistive layer may include tantalum nitride (TaN), nickel chromium (NiCr), tantalum aluminide, chromium silicon, titanium nitride, titanium tungsten, tantalum tungsten, oxides and/or nitrides of such materials, and/or any other suitable thin film resistive materials. The resistive layer may have any suitable thickness.

As another example, the thin film component(s) can include a thin film capacitor including one or more dielectric layers. As examples, the dielectric layer(s) may include one or more suitable ceramic materials. Example suitable materials include alumina ($Al2O3$), aluminum nitride (AlN), beryllium oxide (BeO), aluminum oxide ($Al2O3$), boron nitride (BN), silicon (Si), silicon carbide (SiC), silica ($SiO2$), silicon nitride ($Si3N4$), gallium arsenide (GaAs), gallium nitride (GaN), zirconium dioxide ($ZrO2$), mixtures thereof, oxides and/or nitrides of such materials, or any other suitable ceramic material. Additional example ceramic materials include barium titanate ($BaTiO3$), calcium titanate ($CaTiO3$), zinc oxide (ZnO), ceramics containing low-fire glass, or other glass-bonded materials.

The thin film component can include one or more layers having thicknesses ranging from about 0.001 μm to about 1,000 μm, in some embodiments from about 0.01 μm to about 100 μm, in some embodiments from about 0.1 μm to about 50 μm, in some embodiments from about 0.5 μm to about 20 μm. The respective layer(s) of materials forming thin film component may be applied using specialized techniques based on etching, photolithography, PECVD (Plasma Enhanced Chemical Vapor Deposition) processing or other techniques.

The body of the heat sink component may include any suitable material having a generally low thermal resistivity (e.g., less than about $6.67 \times 10^{-3}$ m° C./W), and a generally high electrical resistivity (e.g., greater than about $10^{14}$ Ω·cm). A thermal resistivity of $6.67 \times 10^{-3}$ m° C./W is equivalent with a thermal conductivity of about 150 W/m° C. In other words, suitable materials for the body of the heat sink component may have a generally high thermal conductivity, such as greater than about 150 W/m° C.

For example, in some embodiments, the body of the heat sink component may be made from a material having a thermal conductivity between about 100 W/m° C. and about 300 W/m° C. at about 22° C. In other embodiments, the body of the heat sink component may be made from a material having a thermal conductivity between about 125 W/m° C. and about 250 W/m° C. at about 22° C. In other embodiments, the body of the heat sink component may be made from a material having a thermal conductivity between about 150 W/m° C. and about 200 W/m° C. at about 22° C.

In some embodiments, the body of the heat sink component may comprise aluminum nitride, beryllium oxide, aluminum oxide, boron nitride, silicon nitride, magnesium oxide, zinc oxide, silicon carbide, any suitable ceramic material, and mixtures thereof.

In some embodiments, the body of the heat sink component may comprise aluminum nitride. For example, in some embodiments the body of the heat sink component may be made from any suitable composition including aluminum nitride. In some embodiments, the body of the heat sink component may be made primarily from aluminum nitride. For example, the body of the heat sink component may contain additives or impurities. In other embodiments, the body of the heat sink component comprises beryllium oxide. For example, in some embodiments the body of the heat sink component may be made from any suitable composition including beryllium oxide. In some embodiments, the body of the heat sink component may be made primarily from beryllium oxide. For example, the body of the heat sink component may contain additives or impurities.

Figure 1B:
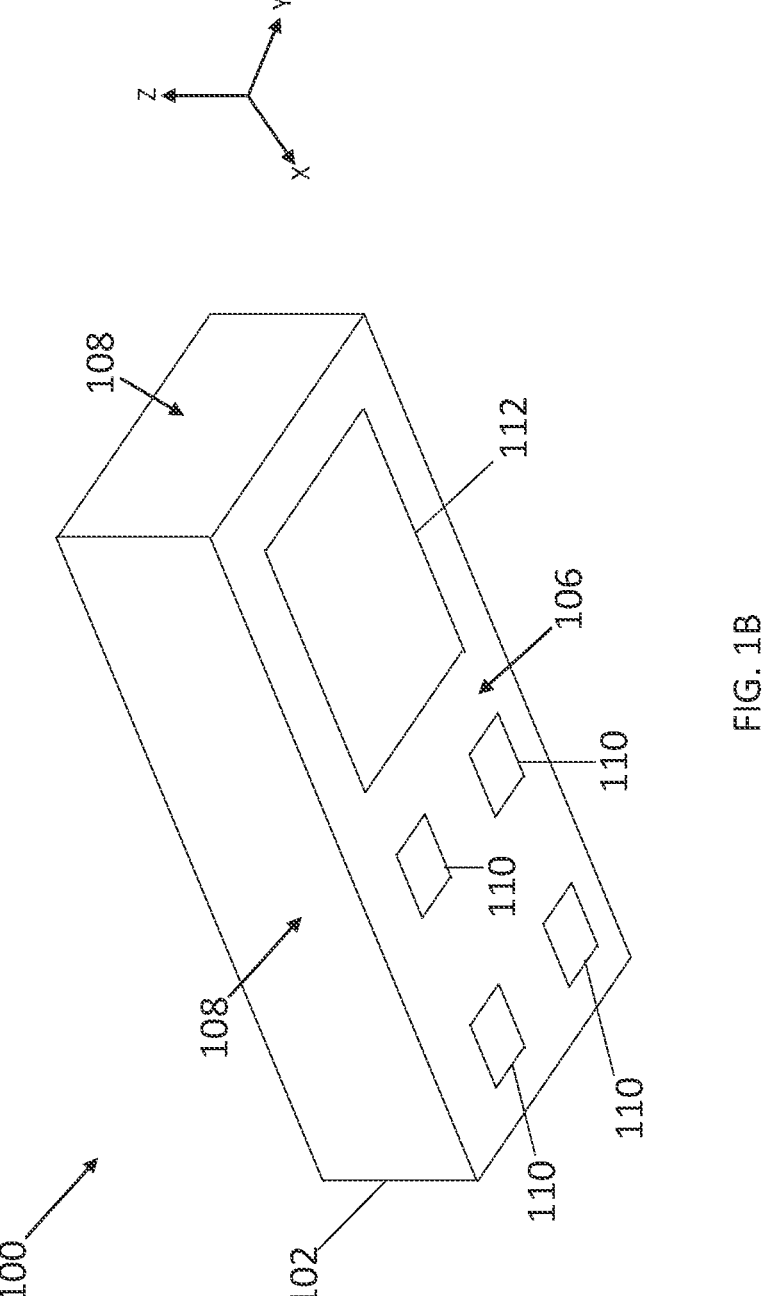
FIG. 1B is a perspective view of a bottom surface of the heat sink component of FIG. 1A.

Referring to FIGS. 1A and 1B, a heat sink component 100 can be configured for land grid array type surface mounting. The heat sink component 100 can include a body 102 including a thermally conductive material that is electrically non-conductive. The body 102 can have a top surface 104, a bottom surface 106 opposite the top surface 104, and a plurality of side surfaces 108. One or more heat source terminals 110 can be formed over the bottom surface 106 of the body 102. The heat source terminal(s) 110 can be configured to connect with one or more respective electrical devices or components and conduct heat into the heat sink component 100 from the electrical devices or components. The heat source terminal(s) 110 can be exposed along the bottom surface 106 of the body 102 for land grid array type mounting of the heat sink component 100. The heat source terminal(s) 110 can be spaced apart from the plurality of side surfaces 108. A heat sink terminal 112 can be formed over the bottom surface 106 of the body 102 for connecting the heat sink component 100 with a heat sink (e.g., of a circuit board to which the heat sink component 100 is mounted). The heat sink terminal 112 can be spaced apart from the plurality of side surfaces 108.

In some embodiments, a plurality of heat source terminals 110 can be formed over the bottom surface 106 of the body 102 of the heat sink component 100. The heat source terminals 110 can be arranged in a variety of configurations. For example, the heat source terminals 110 can be arranged in a grid or other suitable pattern. The heat source terminals 110 can be arranged in a manner that aligns with heat source terminals of a device (e.g., circuit board, electrical component), to which the heat sink component 100 is configured to be mounted.

Figure 2A:
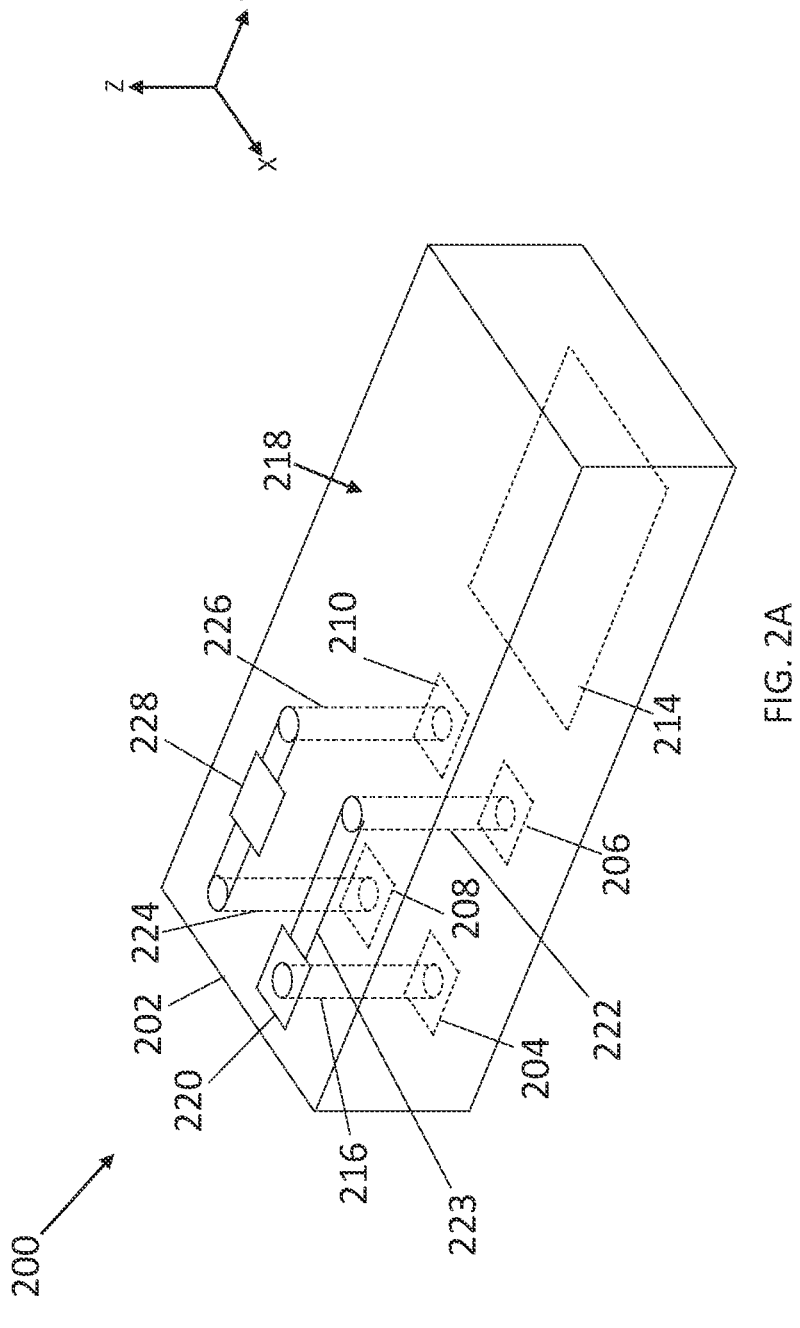
FIG. 2A is a perspective view of an example heat sink component having terminals configured for land grid array type mounting and including a thin film component according to aspects of the present invention.
Figure 2B:
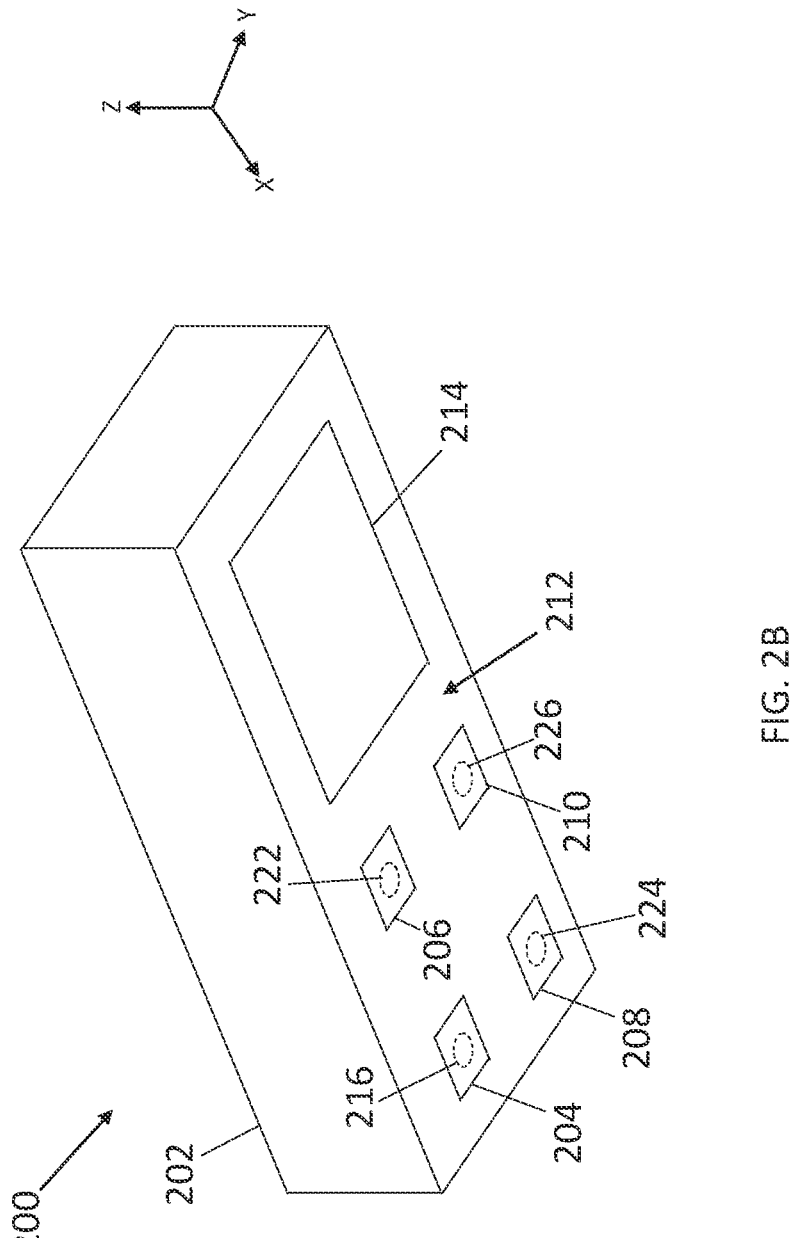
FIG. 2B is a perspective view of a bottom surface of the heat sink component of FIG. 2A.

Referring to FIGS. 2A and 2B, a heat sink component 200 can be generally configured similarly to the heat sink component 100 of FIGS. 1A and 1B. The heat sink component 200 can include a body 202, a plurality of heat source terminals 204, 206, 208, 210 can be formed over a bottom surface 212 of the body 202. A heat sink terminal 214 can be formed over the bottom surface 212 of the body 202.

A first via 216 can extend from the first heat source terminal 204 towards a top surface 218 of the body 202. The first via 216 can connect with a conductive trace 220 formed over the top surface 218 of the body 202. The conductive trace 220 can be configured for connection with another component, for example through a wirebond connection.

A second via 222 can extend from the second heat source terminal 206 to the top surface 218 of the body 202. A conductive trace 223 can connect the conductive trace 220 and first via 216 with the second via 222 such that the first heat source terminal 204 is connected with the second heat source terminal 206.

A third via 224 can extend from the third heat source terminal 208 to the top surface 218. A fourth via 226 can extend from the fourth heat source terminal 210 to the top surface 218. A thin-film component 228 can be formed over the top surface 218 of the body 202 and electrically connected between the vias 224, 226 at the top surface 218 such that the thin-film component 228 is electrically connected between the second heat source terminal 208 and the third heat source terminal 210.

Figure 3A:
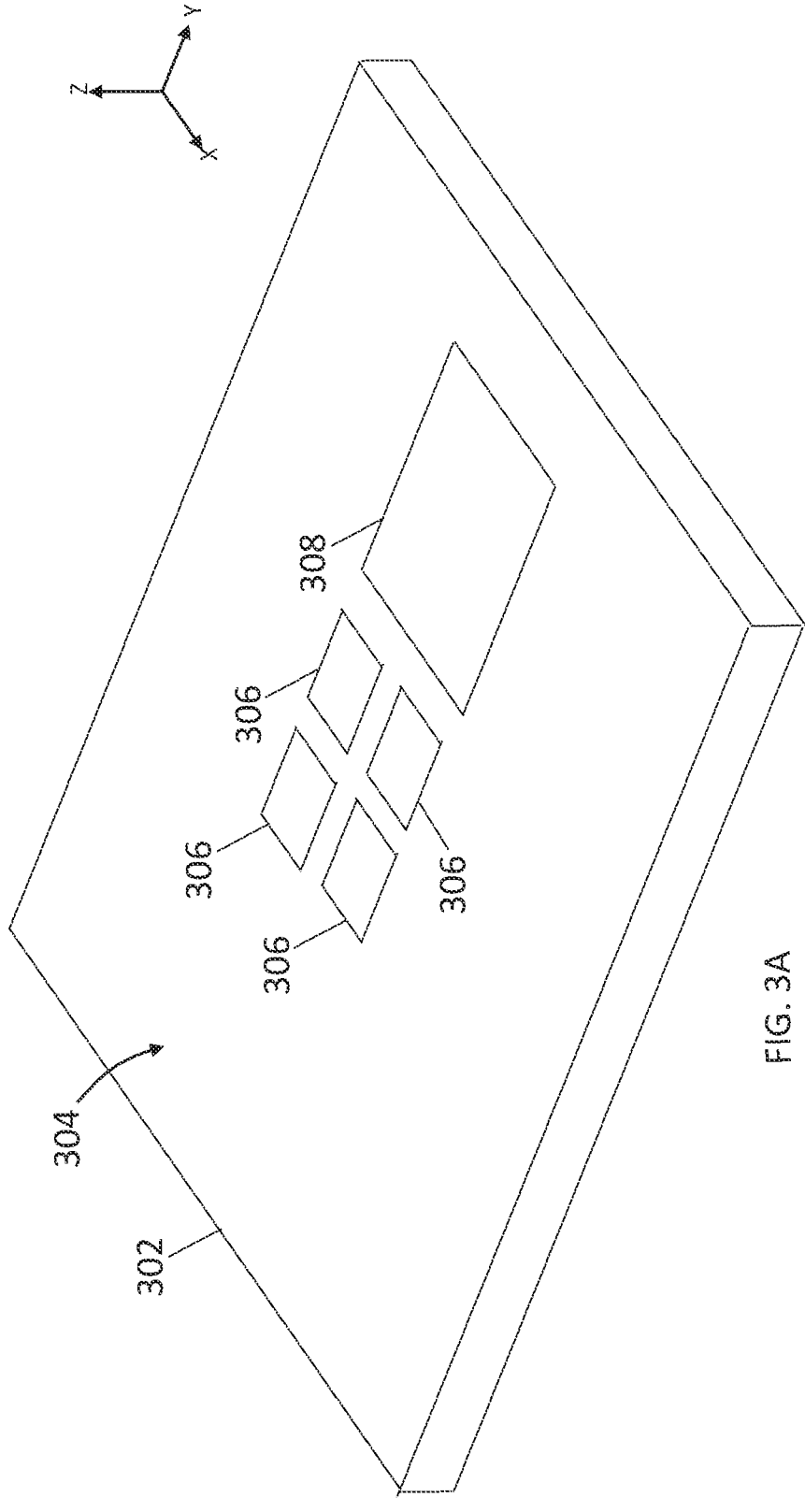
FIG. 3A illustrates an example device of a component assembly according to aspects of the present disclosure.
Figure 3B:
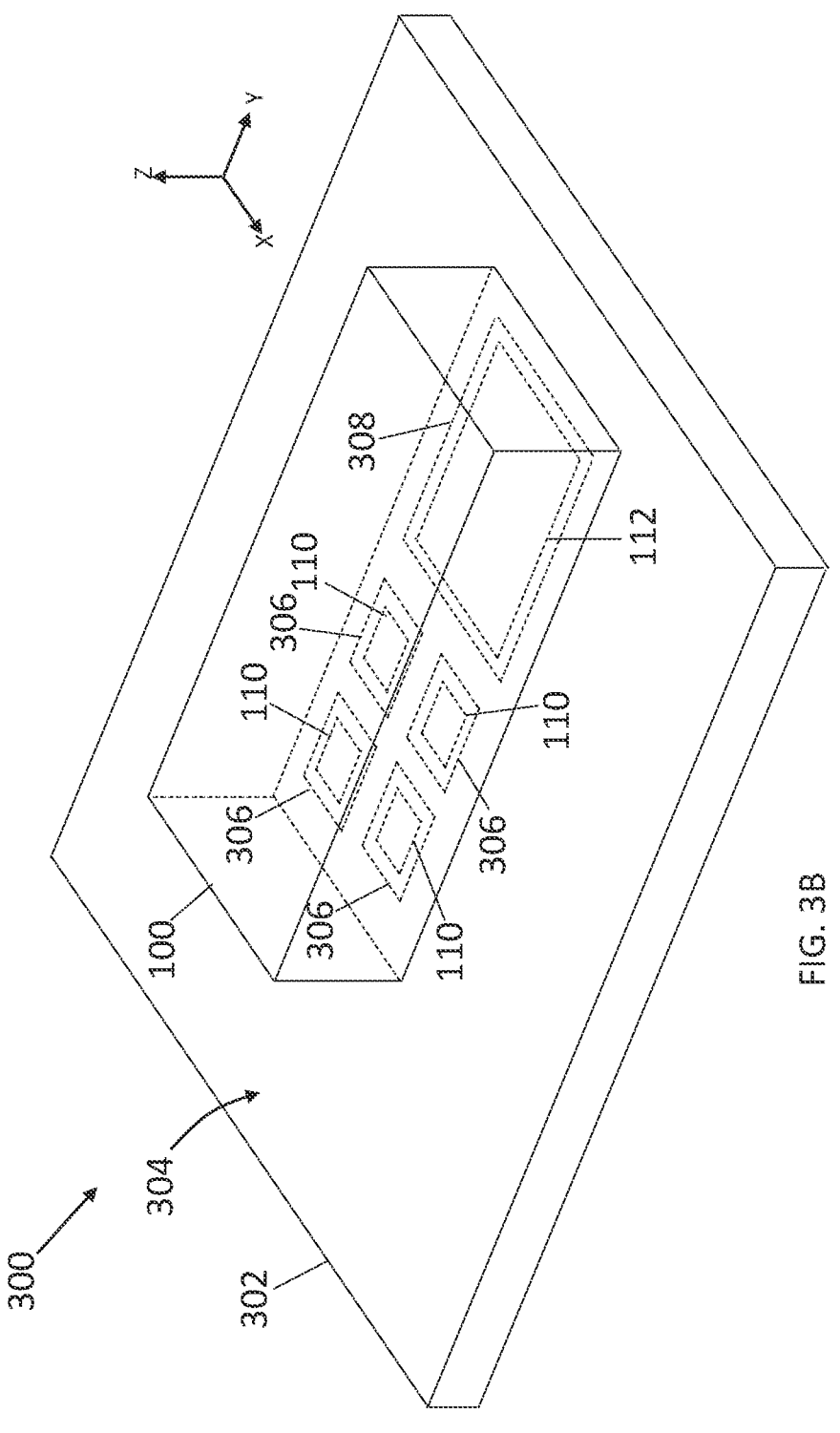
FIG. 3B illustrates an example component assembly including the device of FIG. 3A and the heat sink component of FIG. 1A according to aspects of the present disclosure.

FIGS. 3A and 3B illustrate an embodiment of a component assembly 300 according to aspects of the present disclosure. FIG. 3A illustrates a device 302 to which the heat sink component 100 of FIGS. 1A and 1B can be mounted. FIG. 3B illustrates the heat sink component 100 mounted to the component assembly 300 of FIG. 1A.

The component assembly 300 can include a device 302 comprising a top surface 304 and a plurality of heat source terminals 306 exposed on the top surface 304. One or more heat sink terminals 308 can be exposed on the top surface 304 of the device 302.

The heat sink component 100 can be mounted to the device 302. The heat sink component 100 can generally be configured similarly to the heat sink component 100 of FIGS. 1A and 1B. Each heat source terminal 110 is connected with one of the plurality of heat source terminals 306 of the device 302, and the heat sink terminal 112 is connected with the heat sink terminal 308 of the device 302.

The device 300 can include a circuit board, a multilayer ceramic component, or other suitable electric device. The terminals 306, 308 of the device 302 can be connected with embedded devices, electrodes, components (e.g., capacitors, resistors, inductors, etc.) within the device 300.

FIG. 4 is a flowchart of a method 400 of manufacturing a heat sink component according to aspects of the present disclosure. In general, the method 400 will be described herein with reference to the heat sink components 100, 200 of FIGS. 1A-3B. However, it should be appreciated that the disclosed method 400 may be implemented with any suitable heat sink component. In addition, although FIG. 4 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method can include, at 402, providing a body comprising a thermally conductive material that is electrically non-conductive, the body having a top surface, a bottom surface opposite the top surface, and plurality of side surfaces.

The method can include, at 404, forming a heat source terminal over the bottom surface of the body, the heat source terminal spaced apart from the plurality of side surfaces.

The method can include, at 406, forming a heat sink terminal over the bottom surface of the body, the heat source terminal spaced apart from the plurality of side surfaces.

Applications

The various embodiments of embeddable heat sink components disclosed herein may have a variety of applications.

Example applications include power handling systems and monolithic microwave integrated circuit (MMIC). The heat sink component may facilitate heat flow from terminals of the device that are connected to the heat source terminals of the heat sink device. As examples, various embodiments suitable electrical components can be connected with the terminals of the heat sink component. As examples, the device can include a circuit board (e.g., with embedded components), power amplifier, filter, synthesizer, computer component, power supply, and/or diode, for example. Specific examples of power amplifier types include Gallium Nitride (GaN) power amplifiers, high radio frequency amplifiers, and the like. Examples of diodes which may be suitable for connection with a thermal component, as described herein, may include diodes specifically adapted for use in lasers, among other types of diodes.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A heat sink component comprising:
   a body comprising a thermally conductive material that is electrically non-conductive, the body having a top surface, a bottom surface opposite the top surface along a Z-axis, and a plurality of side surfaces including a first side surface, a second side surface opposite the first side surface, a first end surface, and a second end surface opposite the first end surface, each of the first side surface, the second side surface, the first end surface, and the second end surface extending between the top surface and the bottom surface, the top surface extending in a single plane bound by the first side surface, the second side surface, the first end surface, and the second end surface;
   a first heat source terminal, a second heat source terminal, a third heat source terminal, and a fourth heat source terminal formed over the bottom surface of the body, each of the first heat source terminal, the second heat source terminal, the third heat source terminal, and the fourth heat source terminal spaced apart from the plurality of side surfaces;
   a heat sink terminal formed over the bottom surface of the body, the heat sink terminal spaced apart from the plurality of side surfaces;
   a first via formed in the body, the first via connected with the first heat source terminal and extending to the top surface of the body;
   a second via formed in the body, the second via connected with the second heat source terminal and extending to the top surface of the body;
   a third via formed in the body, the third via connected with the third heat source terminal and extending to the top surface of the body;
   a fourth via formed in the body, the fourth via connected with the fourth heat source terminal and extending to the top surface of the body;
   a thin-film component formed over the top surface of the body and electrically connected between the first via at the top surface and the second via at the top surface such that the thin-film component is electrically connected between the first heat source terminal and the second heat source terminal; and
   a conductive trace formed over the top surface of the body and electrically connected between the third via at the top surface and the fourth via at the top surface such that the third heat source terminal is electrically connected with the fourth heat source terminal,
   wherein the top surface is free of electrically conductive material aligned with the heat sink terminal along the Z-axis, and
   wherein the heat sink terminal is connected with the at least one heat sink terminal of a device at the bottom surface of the heat sink component, the heat sink terminal of the heat sink component configured to conduct heat from the heat sink component to the device through at least one heat sink terminal of the device.

2. The heat sink component of claim 1, wherein the plurality of side surfaces is free of electrically conductive material.

3. The heat sink component of claim 1, wherein the heat sink component comprises a material having a thermal conductivity from about 150 W/m·° C. to about 300 W/m·° C. at about 22° C.

4. The heat sink component of claim 1, wherein the heat sink component comprises aluminum nitride.

5. The heat sink component of claim 1, wherein the heat sink component comprises beryllium oxide.

6. The heat sink component of claim 1, wherein the thin-film component comprises a capacitor.

7. The heat sink component of claim 1, wherein the thin-film component comprises a varistor.

8. The heat sink component of claim 1, wherein the thin-film component comprises an inductor.

9. The heat sink component of claim 1, wherein the heat sink terminal is free of direct connection with any electrically conductive element of the heat sink component.

10. The heat sink component of claim 1, wherein the top surface of the body includes a first portion and a second portion, the first portion co-planar with the second portion, wherein the first via, the second via, the third via, and the fourth via extend to the first portion of the top surface, and wherein the heat sink terminal is formed over the bottom surface of the body opposite the second portion of the top surface.

11. A component assembly comprising:
    a device comprising a top surface, wherein a plurality of heat source terminals and at least one heat sink terminal are exposed on the top surface; and
    a heat sink component mounted to the device, the heat sink component comprising:
       a body comprising a thermally conductive material that is electrically non-conductive, the body having a top surface, a bottom surface opposite the top surface, and a plurality of side surfaces including a first side surface, a second side surface opposite the first side surface, a first end surface, and a second end surface opposite the first end surface, each of the first side surface, the second side surface, the first end surface, and the second end surface extending between the top surface and the bottom surface, the top surface extending in a single plane bound by the first side surface, the second side surface, the first end surface, and the second end surface,
       a first heat source terminal, a second heat source terminal, a third heat source terminal, and a fourth heat source terminal formed over the bottom surface of the body, each of the first heat source terminal, the second heat source terminal, the third heat source terminal, and the fourth heat source terminal spaced apart from the plurality of side surfaces of the body,
       a heat sink terminal formed over the bottom surface of the body, the heat sink terminal spaced apart from the plurality of side surfaces,
       a first via formed in the body, the first via connected with the first heat source terminal and extending to the top surface of the body,
       a second via formed in the body, the second via connected with the second heat source terminal and extending to the top surface of the body,
       a third via formed in the body, the third via connected with the third heat source terminal and extending to the top surface of the body, a fourth via formed in the body, the fourth via connected with the fourth heat source terminal and extending to the top surface of the body, a thin-film component formed over the top surface of the body and electrically connected between the first via at the top surface and the second via at the top surface such that the thin-film component is electrically connected between the first heat source terminal and the second heat source terminal, and a conductive trace formed over the top surface of the body and electrically connected between the third via at the top surface and the fourth via at the top surface such that the third heat source terminal is electrically connected with the fourth heat source terminal, wherein each of the first heat source terminal, the second heat source terminal, the third heat source terminal, and the fourth heat source terminal is connected with a respective one of the plurality of heat source terminals of the device, and wherein the heat sink terminal is connected with the at least one heat sink terminal of the device at the bottom surface of the heat sink component, the heat sink terminal of the heat sink component configured to conduct heat from the heat sink component to the device through the at least one heat sink terminal of the device.

12. The component assembly of claim 11, wherein the device comprises a circuit board.

13. The component assembly of claim 11, wherein the device comprises a multilayer ceramic component.

14. The component assembly of claim 11, wherein the plurality of side surfaces of the body of the heat sink component are free of electrically conductive material.

15. The component assembly of claim 11, wherein the heat sink component comprises a material having a thermal conductivity from about 150 W/m·° C. to about 300 W/m·° C. at about 22° C.

16. The component assembly of claim 11, wherein the heat sink component comprises aluminum nitride.

17. The component assembly of claim 11, wherein the heat sink component comprises beryllium oxide.

18. A method of manufacturing a heat sink component, the method comprising:

providing a body comprising a thermally conductive material that is electrically non-conductive, the body having a top surface, a bottom surface opposite the top surface along a Z-axis, and a plurality of side surfaces including a first side surface, a second side surface opposite the first side surface, a first end surface, and a second end surface opposite the first end surface, each of the first side surface, the second side surface, the first end surface, and the second end surface extending between the top surface and the bottom surface, the top surface extending in a single plane bound by the first side surface, the second side surface, the first end surface, and the second end surface;

forming a heat source terminal over the bottom surface of the body, the heat source terminal spaced apart from the plurality of side surfaces;

forming a heat sink terminal over the bottom surface of the body, the heat sink terminal spaced apart from the plurality of side surfaces, the heat sink terminal free of connections with any electrically conductive element of the heat sink component;

forming a second heat source terminal, a third heat source terminal, and a fourth heat source terminal over the bottom surface of the body, each of the second heat source terminal, the third heat source terminal, and the fourth heat source terminal spaced apart from the plurality of side surfaces;

forming a first via in the body, the first via connected with the first heat source terminal and extending to the top surface of the body;

forming a second via in the body, the second via connected with the second heat source terminal and extending to the top surface of the body;

forming a third via in the body, the third via connected with the third heat source terminal and extending to the top surface of the body;

forming a fourth via in the body, the fourth via connected with the fourth heat source terminal and extending to the top surface of the body;

forming a thin-film component over the top surface of the body from the first via to the second via such that the thin-film component is electrically connected between the first heat source terminal and the second heat source terminal; and forming a conductive trace over the top surface of the body from the third via to the fourth via such that the third heat source terminal is electrically connected with the fourth heat source terminal, wherein the top surface is free of electrically conductive material aligned with the heat sink terminal along the Z-axis, and wherein the heat sink terminal is connected with the at least one heat sink terminal of a device at the bottom surface of the heat sink component, the heat sink terminal of the heat sink component configured to conduct heat from the heat sink component to the device through at least one heat sink terminal of the device.

\* \* \* \* \*